US011408918B2

(12) United States Patent
Hiremath

(10) Patent No.: US 11,408,918 B2
(45) Date of Patent: Aug. 9, 2022

(54) MICRO-DISCONTINUITY MEASUREMENT AND SIMULATION DEVICES AND METHODS

(71) Applicant: IDEAL Industries Lighting LLC, Durham, NC (US)

(72) Inventor: Amruteshwar Hiremath, Cary, NC (US)

(73) Assignee: IDEAL INDUSTRIES LIGHTING LLC, Durham, NC (US)

( * ) Notice: Subject to any disclaimer, the term of this patent is extended or adjusted under 35 U.S.C. 154(b) by 0 days.

(21) Appl. No.: 17/064,147

(22) Filed: Oct. 6, 2020

(65) Prior Publication Data

US 2022/0107344 A1 Apr. 7, 2022

(51) Int. Cl.
*G01R 23/20* (2006.01)
*G01R 19/165* (2006.01)
*G01R 1/20* (2006.01)

(52) U.S. Cl.
CPC ....... *G01R 19/16538* (2013.01); *G01R 1/206* (2013.01)

(58) Field of Classification Search
CPC .............. G01R 31/31924; G01R 31/26; G01R 31/2642; G01R 31/2648; G01R 31/2831; G01R 31/31702
See application file for complete search history.

(56) References Cited

U.S. PATENT DOCUMENTS

| 6,946,866 B2 * | 9/2005 | Thurairajaratnam .................. G01R 31/2886 324/534 |
| 2004/0155240 A1 * | 8/2004 | Howland ........... G01R 31/2831 257/48 |

* cited by examiner

*Primary Examiner* — Tung X Nguyen

(74) *Attorney, Agent, or Firm* — Greenberg Traurig, LLP

(57) ABSTRACT

An electrical measurement apparatus may include a bias voltage generator configured to generate and output a bias voltage, a bias probe coupled to the output of bias voltage generator configured to apply voltage bias to a first portion of an external circuit which may be subjected to environmental stresses such as vibration, temperature, humidity etc., a measurement probe configured to receive a second electrical signal from a second portion of the external circuit, and a control unit configured to control the bias voltage generator to generate different bias voltages, patterns, AC/DC etc., receive the second electrical signal from the measurement probe and cause the device to output a response in the second electrical signal to the time-domain discontinuity in the first electrical signal.

20 Claims, 13 Drawing Sheets

MICRO-DISCONTINUITY MEASUREMENT AND SIMULATION DEVICES AND METHODS

TECHNICAL FIELD

This disclosure generally relates to a device for measurement and simulation of micro-discontinuities in an electrical circuit.

BACKGROUND

In electrical and electronics systems, product reliability is of utmost importance. Electrical and electronics systems commonly include circuits (including circuitry and components of circuits) such as connectors, wire harnesses, flexible wiring links, etc. to interface one subsystem to another for many types of signals, including analog data signals, digital data signals, or power. Although connectors are ubiquitous, they are also one of the most common reasons for failures. Even in well-designed and well-assembled circuits and systems, connectors and other components may fail due to environmental stresses such as vibrations, temperature changes, humidity, etc., which can lead to oxidation, fretting, and/or impedance changes, which in turn may alter the signal transmission characteristics within the circuit and cause device failure or unreliability. Small connector failures, after they grow large with time, may appear as "latent failures." In reality, an interconnect issue may exist immediately after manufacture if the component is placed under the "right" environmental stress, but may not be perceived by the design team due to the lack of measurement and simulation devices.

DETAILED DESCRIPTION

Figure 1:
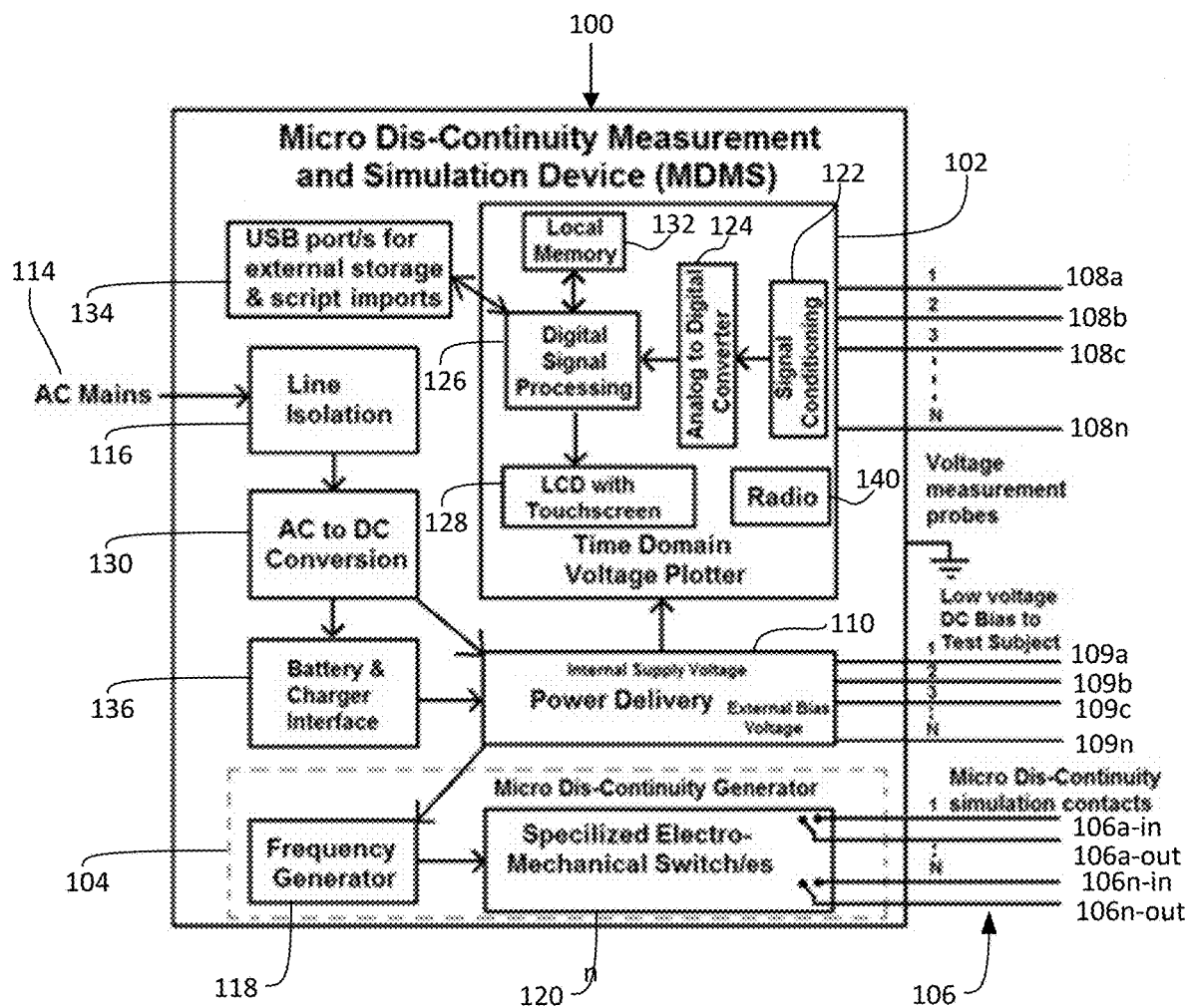
FIG. 1 is a schematic and block diagram of an example embodiment of a micro-discontinuity measurement and simulation device.

Micro-discontinuities or intermittencies may occur in circuits (e.g., in interconnects within circuits) because of an incorrect choice of mating materials, improper sizing of electrical parameters (e.g., current), or may be induced by environmental effects such as vibration, temperature, humidity, etc. Micro-discontinuities may go unnoticed due to lack of measurement devices leading to future failure, causing expensive product returns and brand image damage.

Known devices for measuring circuit performance generally do not measure, detect, or simulate micro-discontinuities. Continuity meters that generate an audible tone when continuity is established are known, but continuity meters do not detect or measure micro-discontinuities or intermittencies that can lead to latent failures. Ohm meters measure the resistance of a circuit but similarly do not detect or measure micro-discontinuities or intermittencies.

The instant disclosure makes reference to discontinuities and micro-discontinuities. As used herein, a discontinuity refers to a broken circuit, such as a broken contact or wire, or an intermittently broken (make and break) circuit that may re-establish connection in the order of seconds. A discontinuity may result in a time-domain interruption in a signal in the circuit, which signal interruption may be referred to herein as a time-domain discontinuity or a temporal discontinuity. A micro-discontinuity is a specific type of discontinuity and may be used to refer to an unintended broken circuit (e.g., in response to an environmental stress or a particular input signal) that may re-establish connection in a fraction of a second. The term "micro" is used to represent "small" and not necessarily the order of $10^{-6}$. For example, a micro-discontinuity may re-establish connection on the order of milli- ($10^{-3}$), micro- ($10^{-6}$), nano- ($10^{-9}$), or pico- ($10^{-12}$) seconds, in embodiments. Micro-discontinuities, though small, may result in unreliable electrical functionality that is prone to errors. Such unintended makes and breaks of contacts generally cause latent failures. When the makes/breaks are very small, they may not always cause issues to be noticeable during product design phase (and hence design teams generally miss them during development) but with time and under natural environmental stresses such as vibrations, temperature, humidity, air quality etc. they show up as intermittent system level issues such as occasional missed data packets or failed CRC (Cyclic Redundancy Checks) for digital systems or drastic jumps/changes in voltage, impedance, current for analog systems.

The present disclosure includes devices and methods for detecting, measuring, and/or characterizing micro-discontinuities or intermittencies using, for example, a standalone, portable, robust device with customizable detection patterns and simplicity of use. The present disclosure enables detection of latent failures and physical micro-discontinuities in electrical circuits during the design cycle, thereby enabling development of more reliable electrical circuits and products.

The present disclosure also enables, in some embodiments, generation of time-domain signal discontinuities (e.g., to simulate real world physical micro-discontinuities) and measuring or monitoring the response of a circuit or system to the signal that includes the generated discontinuity. Such testing may improve product and system design. For example, in a physical communication system, data packets may be corrupted in a compromised product line in absence of proper data integrity checking algorithm, and simulation of micro-discontinuities (thereby simulating a compromised product line) enables testing of the data integrity checking algorithm. Introducing micro-discontinuities in a circuit is a good way to see the effect of such discontinuities and to determine which types of discontinuities alter system performance, which enables a determination of how the system can be made more robust (hardware-wise and/or software-wise) during development of the circuit (e.g., a system or product of which the circuit is a part).

The instant disclosure presents example devices and implementations for detecting physical defects in electrical signal transmission lines by detecting temporal micro-discontinuities and/or simulating them. Such a device may be a portable, robust, stand-alone product and may be referred to herein as a "Micro-discontinuity Measurement and Simulation (MDMS) device." An MDMS device according to the present disclosure may include customizable detection patterns, may be user-friendly and easy to use, and may be constructed to withstand harsh environmental conditions. Further, an MDMS device according to the present disclosure may be used to identify micro-discontinuities for any form of circuit or portion thereof, such as connectors, static wires, rigid printed circuit board (PCB) traces, printed wiring board (PWB) traces, flexible PWB traces, rigid flex circuits, electro-mechanical switching circuits such as relays and switches, or any other type of electrical transmission line. In some embodiments, the MDMS device may be used during or after exposing the test subject to one of more environmental stresses or extended or exaggerated nominal use.

An MDMS device according to the present disclosure may also generate or simulate a micro-discontinuity in one portion of a circuit to measure the response of other components and connections in the system by measuring a signal in another portion of the circuit. For example, in a physical communication system, data packets may be corrupted in a compromised product line in absence of a proper data integrity checking algorithm. Further, simulating a micro-discontinuity in a communication interface may be used to determine the effect of such discontinuities and to determine how the system can be made more robust (both hardware-wise as well as software-wise) during the development cycle of the product.

FIG. 1 is a block diagram view of an example MDMS device 100. The MDMS device may include a physical discontinuity detector 102 (which may be referred to herein as the "detector 102"), one or more voltage measurement probes 108 (which may be referred to herein as "measurement probes 108") electrically coupled to the detector 102, a power delivery/external bias voltage generator module 110 (which may be referred to herein as "external bias module 110"), one or more voltage bias probes 109 driven by the external bias module 110, an electrical discontinuity generator 104 (which may be referred to herein as the "generator 104"), and one or more discontinuity inducement probes 106 (which may be referred to herein as "simulator probes 106") electrically coupled to the generator 104. The device 100 may be configured to be electrically coupled to an external circuit 112 (first shown in FIG. 3), as will be described below.

The detector 102 may include a signal conditioning circuit 122 for the voltage from measurement probes 108 and an analog-to-digital (A/D) converter 124 to digitize the conditioned voltage measured by the measurement probes 108. The A/D converter 124 may input to a digital signal processor (DSP) 126 configured to perform one or more processing and analysis operations (e.g., discontinuity detection, math operations, etc.) on the digital signal from the A/D converter 124. A digitized representation of the signal received by the detector 102 may be output (e.g., plotted, charted, graphed, etc.) by the DSP 126 on a display 128 to display the dynamic digitized representation or processed signal data from the measurement probes 108 with an appropriate time resolution. The display 128 may be a graphic LCD, for example. In some embodiments, to properly display a response to time-domain discontinuities, the plot may be output with a millisecond, microsecond, nanosecond, or other appropriate resolution. In some embodiments, the time resolution of the plot may be set or selected to display a time resolution required to see output of a micro-discontinuity. Accordingly, the DSP 126 may be configured to determine the waveform present on one or more of the measurement probes 108 with a microsecond or nanosecond resolution.

The generator 104 may include a signal generator 118 and one or more (e.g., a plurality of) switches 120. The signal generator 118 may be configured to generate one or more signal waveforms, such as sine waves, square waves, sawtooth waves, etc. The one or more switches 120 may be electrically coupled to an output of the signal generator 118 and may be modulated to introduce time-domain discontinuities (e.g., micro-discontinuities) in the signals output to the external circuit 112. Accordingly, the output of the generator 104 may include such time-domain discontinuities.

The switches 120 may be or may include one or more electro-mechanical switches controlled to oscillate at one or more frequencies to simulate time domain micro-discontinuities in a signal to the external circuit. For example, one or more frequencies of the switches 120 may simulate the effects of various environmental stresses such as, for example, the effect of an HVAC system on light fixtures, the effect of car engine vibration on electrical components in the car, etc. One or more of the frequencies may be predetermined and programmed into the device 100, in some embodiments. Additionally or alternatively, the device 100 may accept one or more user-defined frequencies for one or more switches 120.

In general, the detector 102 may be electrically connected to a circuit portion (i.e., a portion of circuit 112) and measure and/or output the signal at that circuit portion to determine if the circuit 112 includes a physical discontinuity, such as a micro-discontinuity. In general, the generator 104 may be connected to a portion of the circuit 112 to input a signal that may include a simulated micro-discontinuity—e.g, in conjunction with the detector 102 measuring the response in a related portion of the circuit 112. Still further, the voltage bias probes 109 driven by the external bias 110 may be connected to a portion of the circuit 112 to input a bias voltage. Accordingly, the measurement probes 108, voltage bias probes 109 and simulator probes 106 may be used to electrically couple the detector 102, generator 104, and/or external bias 110 to the circuit 112 to input one or more DC or AC signals and measure responses at one or more points in the circuit 112.

It should be noted that, although a specific number of measurement probes 108, voltage bias probes 109, and simulator probes 106 are illustrated and described in various embodiments of this disclosure, a device 100 may include any number of probes supported by the hardware of the device 100. For example, a device may include two or more, five or more, ten or more, or another number of each of measurement probes 108, voltage bias probes 109, and simulator probes 106, in various embodiments.

The device 100, including the generator 104, the detector 102, the power delivery/external bias voltage generator module 110, and other portions, may receive power from AC mains input 114 or other AC power source, in an embodiment. The same AC mains input 114 may provide input power to the external circuit 112, in some embodiments. The device 100 may include a line-isolating module 116 electrically coupled to AC mains input 114 to isolate the AC input 114 for the device 100 from the external circuit 112.

The device 100 may further include an AC/DC converter 130 configured to receive the input AC voltage and output a DC voltage for use within the device 100. The power delivery/external bias voltage generator module 110 may receive power from the AC/DC converter 130 and generate required system voltage rails as well as one or more low voltage, current limited DC bias voltages for the external circuit 112, as described above and below.

The device 100 may also include a number of components for user input and output. As noted above, the device 100 may include a display 128 on which any of the internal and external signals described above may be output, including signals from the generator 104, bias voltage signals from the power delivery/external bias voltage generator module 110, and the signals detected by the detector 102. Further, the device 100 may include an internal memory device 132 and/or may include a USB or similar port 134 to connect to an external memory configured to store user settings, characteristics of waveforms for the generator 104, and signal waveforms detected and measured by the detector 102, for example. The device 100 may further include a battery and charger interface 136 for charging and storing local power that may be used to power the device 100 when AC mains power 114 is not available. Accordingly, the device 100 may be portable and mobile, in some embodiments. The device 100 may further include a radio 140 for electronic communications with one or more other devices 100 and/or other computing devices, such as to output one or more signals described herein or to receive user input, for example.

In operation, the voltage that is read on the voltage measurement probes by the detector 102 may be representative of the quality of the signal path within the external circuit 112 under test (e.g., the signal path between a respective voltage bias probe 109*a* inputting a signal to first portion of circuit 112 and a voltage measurement probe 108*a* measuring the responsive or consequent signal at another portion of the circuit 112). For example, if the signal path includes any physical discontinuities (e.g., micro-discontinuities), that discontinuity may result in a temporal interruption or anomaly in the voltage signal on a voltage measurement probe 108 responsive to natural environmental stress on the circuit 112, such as vibration, temperature, or humidity, or simulated environmental stress inflicted on the circuit 112, and/or in response to simulated time domain micro discontinuities output by the device 100 to the external circuit 112. A real-time representation of the contact discontinuity may be displayed on the display 128. For example, where the circuit under test is a simple connector or other transmission line, a flat line near the applied DC bias voltage (logic "high") represents good contact quality, and a disturbed noisy pattern or toggling between logic "high" & "low" represents micro-discontinuity or connection intermittencies, in some embodiments. The displayed information can be stored in local memory 132 or an external storage media attached to the USB port 134 or transmitted to a central hub via the radio 140.

In some embodiments, the DSP 126, power delivery/external bias voltage generator module 110, signal generator 118, and/or switches 120 may include one or more control units (also referred to herein as a controller or electronic controller), or may collectively include or define a control unit, for executing one or more programmable functions of the device 100. For example, a control unit of the device 100 may include a processor and a non-transitory, computer-readable memory storing instructions that, when executed by the processor, cause the processor to perform one or more software functions or other functions of this disclosure. For example, such a processor and memory may be embodied in the DSP 126.

In some embodiments, the controller of the device 100 may be configured to execute various testing strategies to attempt to induce and/or identify physical discontinuities in the external circuit 112. For example, the controller may be configured to output different voltage patterns or levels in the bias voltage from the power delivery/external bias voltage generator module 110, and to coordinate oscillation of one or more switches 120 with such voltage levels, to test for discontinuities induced at or by different combinations of voltages, frequencies and disturbances. In some embodiments, the controller may be configured to perform a method that includes outputting a stepped or otherwise variable bias voltage, monitoring one or more locations in the circuit under test, and to output an indication of a discontinuity at a particular bias voltage in the circuit under test. An example of such a method will be discussed with respect to FIGS. 12 and 13.

The controller of the device 100 (specifically, the control capabilities of the DSP 126, in some embodiments) may further be configured to execute one or more measurement and analysis algorithms or strategies to assess the signals received from the external circuit 112 and determine whether or not, or to what extent, the external circuit 112 includes physical micro-discontinuities. For example, the controller may be configured to measure an amplitude and frequency of each signal received from the external circuit 112 to determine the repetition rate or duration of the physical discontinuity. Further, the controller may apply one of more mathematical operations to received signals from the external circuit, such as addition, subtraction, differentiation, integration, Fourier transformations such as FFT, trigonometric functions, low/high/band pass filters, etc., and may display the result of such operations on the display 128.

In some embodiments, the controller of the device 100 may execute one or more output operations to aid a user in recognizing when and where a discontinuity is induced in the external circuit 112, and to aid storage and review of test data. For example, the controller may automatically identify time-domain discontinuities in a signal from the external circuit 112, or fluttering or other signals characteristic of a physical discontinuity in the circuit 112. The controller may output indicators on the display 128 of those discontinuities. The result of one or more mathematical operations may be output in real-time or substantially real-time to enable the user to conduct further testing to attempt to reproduce an issue. The controller may accept user programmed operations, either via the radio 140 from a user computing device or via the USB port 134 or other port, store those operations in the memory 132 or other memory of the device 100, and execute those operations when selected by the user. Such operations may include, for example, sequences of bias voltages and/or switch modulation frequencies and patterns, mathematical operations to be executed on the signals received from the external circuit 112, etc. Further, the controller may accept control commands from, or output any display or other output data described herein, to/from a user computing device, such as wirelessly with the radio 140. As noted above, any signals created by or received by the device 100 may be output on the display 128, with automatic and/or manual scaling of time and amplitude.

Figure 2:
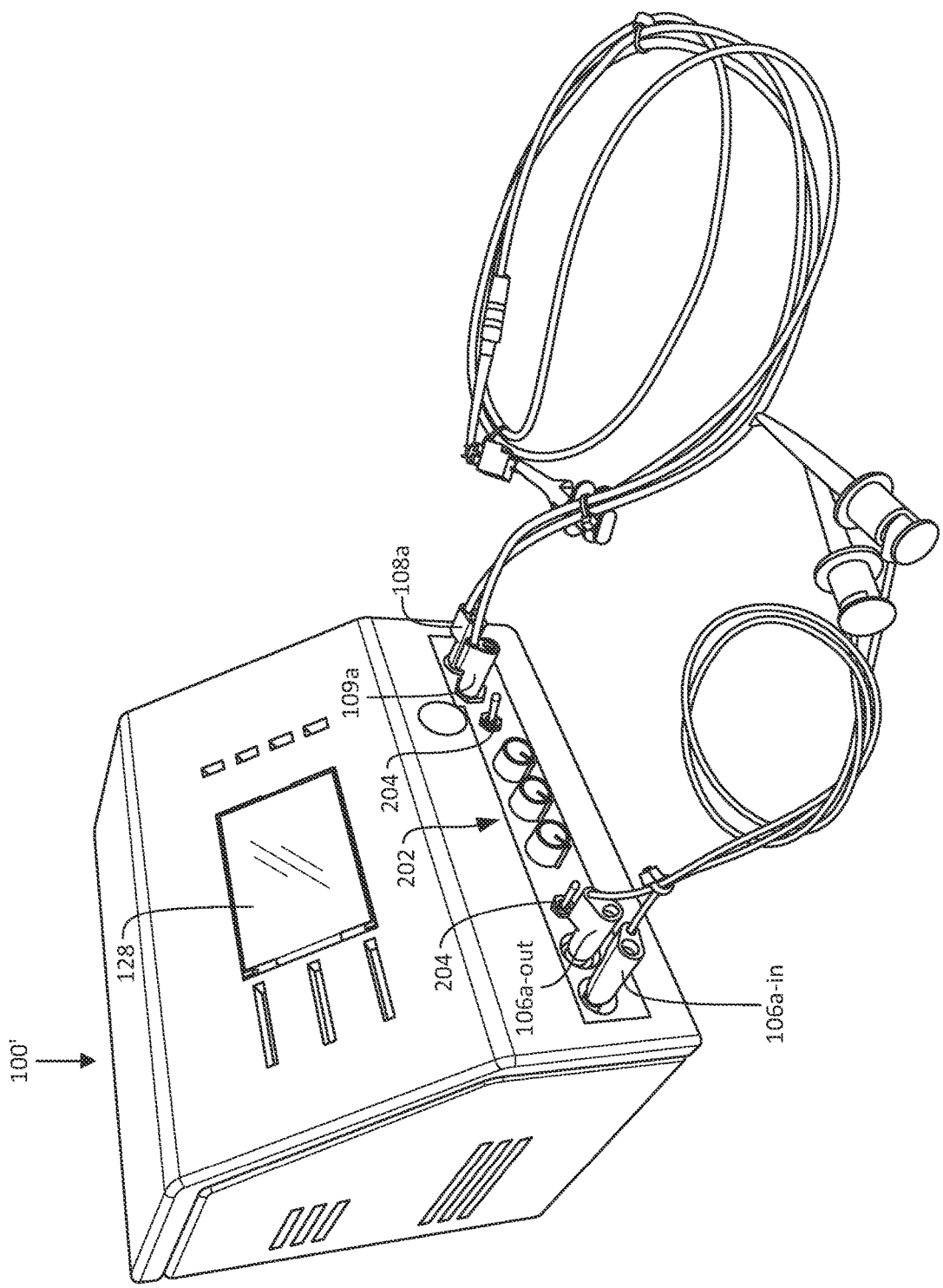
FIG. 2 is an isometric view of an example embodiment of a micro-discontinuity measurement and simulation device.

The device 100 (e.g., the controller of the device 100) may accept user input through one or more input knobs or buttons (examples of which will be shown and described with respect to FIG. 2), through the display 128 (which may be a touch screen display), from a user computing device through the radio 140, or through other appropriate wired or wireless transmission.

FIG. 2 is a front exterior perspective view of an example MDMS device 100', which is an embodiment of the MDMS device 100. The example device 100' includes a display 128, one voltage measurement probe 108a, one bias voltage probe 109a (together forming a pair of micro-discontinuity measurement probes), one external signal input 106a-in and one micro discontinuity inflicted signal output 106a-out (together forming a micro-discontinuity simulator probes pair) and a plurality of input knobs 202 and input switches 204. The voltage measurement probe 108a may be electrically coupled to a detector (not shown in FIG. 2) of the device 100', and the simulation probes 106a-in, 106a-out may be connected to a generator (not shown in FIG. 2) of the device 100'. The input knobs 202 and switches 204 may be used by a user to, for example, toggle input power to the device 100', set an operating mode, toggle or set characteristics of output signals of the generator and/or bias from the external bias module 110 of the device 100', set or select one or more settings of the device 100', such as a frequency of one or more switches, one or more bias voltage values, and one or more display settings or mathematical operations to be applied to a signal detected from an external circuit under test. As described above with respect to FIG. 1, the device 100' may output one or more AC signals or DC bias signals through the bias probe 109a, receive one or more signals with the voltage measurement probes 108a, introduce one or more time domain micro-discontinuities into an external circuit 112 through simulator probes 106a-in and 106a-out, and output one or more of the output and/or received signals, or analyses thereof, on the display 128.

Figure 3:
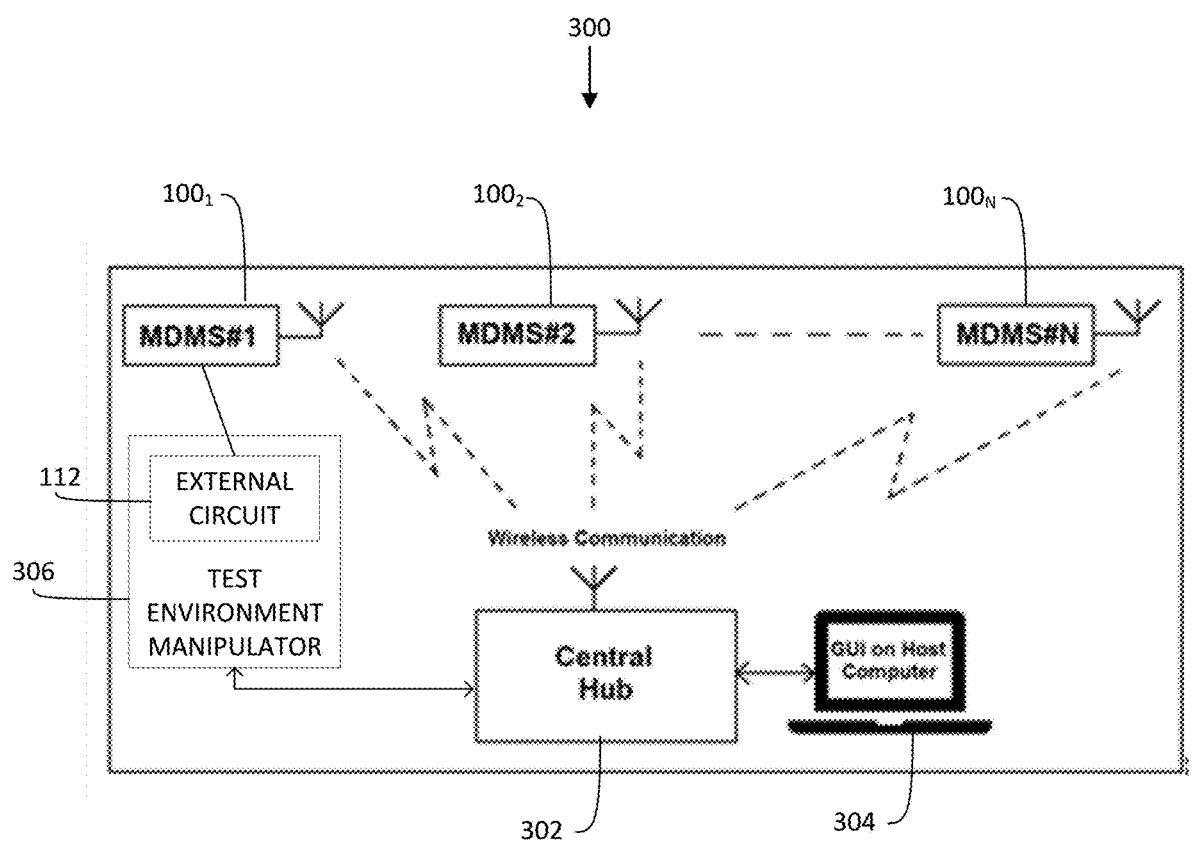
FIG. 3 is a block diagram of an example system for measurement and simulation of micro discontinuities in respective electrical signals of a plurality of circuits.

FIG. 3 is a diagrammatic view of an example system 300 for testing one or more external circuits with a plurality of MDMS devices 100. The system 300 includes a plurality of MDMS devices 1001, 1002, . . . 100N (which may be referred to collectively as the devices 100, or individually as a device 100). The devices 100 are in electronic communication with a central hub 302, and the central hub 302 is in communication with a user computing device 304. In some embodiments, the user computing device 304 may serve as the central hub 302 and may be in direct communication with the MDMS devices 100.

Each of the devices 100 may be electrically coupled with an external circuit (a single such circuit 112 is shown in FIG. 3). Two or more devices 100 may be coupled to a single external circuit (e.g., to test different portions of the circuit with different devices 100), in some embodiments. In other embodiments, each device 100 may be electrically coupled with a respective external circuit.

One or more external circuits 112 may be coupled with or disposed in one or more test environment manipulators 306. A test environment manipulator 306 may include one or more devices for applying one or more physical stresses to the external circuit 112, such as bending, vibrating, temperature changes, humidity changes, and the like. The test environment manipulators 306 may be in communication with the user computing device 304 (e.g., via the hub 302) for user monitoring and/or control of the test environment manipulators 306. As a result, the testing strategies of one or more MDMS devices 100 may be coordinated with one or more of the above-noted environmental manipulations.

Figure 4:
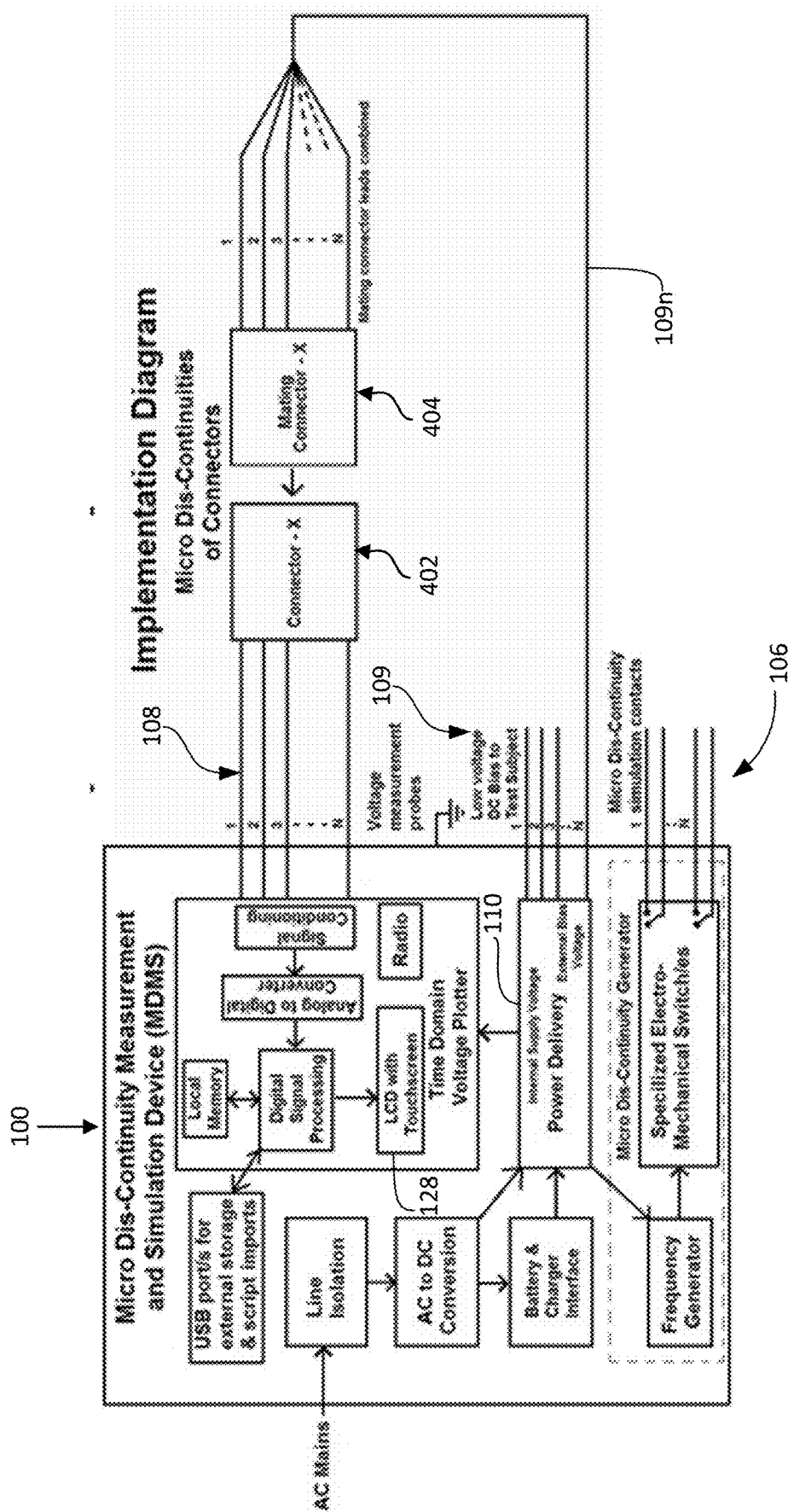
FIG. 4 is a schematic and block diagram view of an example embodiment of a micro-discontinuity measurement and simulation device in an example implementation for micro discontinuity detection.

FIG. 4 is a diagrammatic view of an example implementation of an MDMS device 100 demonstrating micro-discontinuity measurement functionality. Specifically, in FIG. 4, the device 100 is implemented to measure discontinuities across a plurality of leads of a connector 402 and mating connector 404 as a test circuit. A micro discontinuity measurement may be performed by generating a desired bias voltage on a voltage bias probe 109, applying the bias voltage it to a lead of mating connector 404, and measuring the voltage on the corresponding lead of the connector 402 through a probe 108. In the example of FIG. 4, no simulated time-domain discontinuity or other time-varying signal is applied. The MDMS device 100 may plot the measured voltage on the display 128, revealing any contact discontinuities or intermittencies in the connector 402 or mating connector 404. In some embodiments, physical stress may be applied to the connector 402 and mating connector 404 while inputting the bias voltage to determine whether such stress exposes any potential latent failures in the form of micro-discontinuities.

Figure 5:
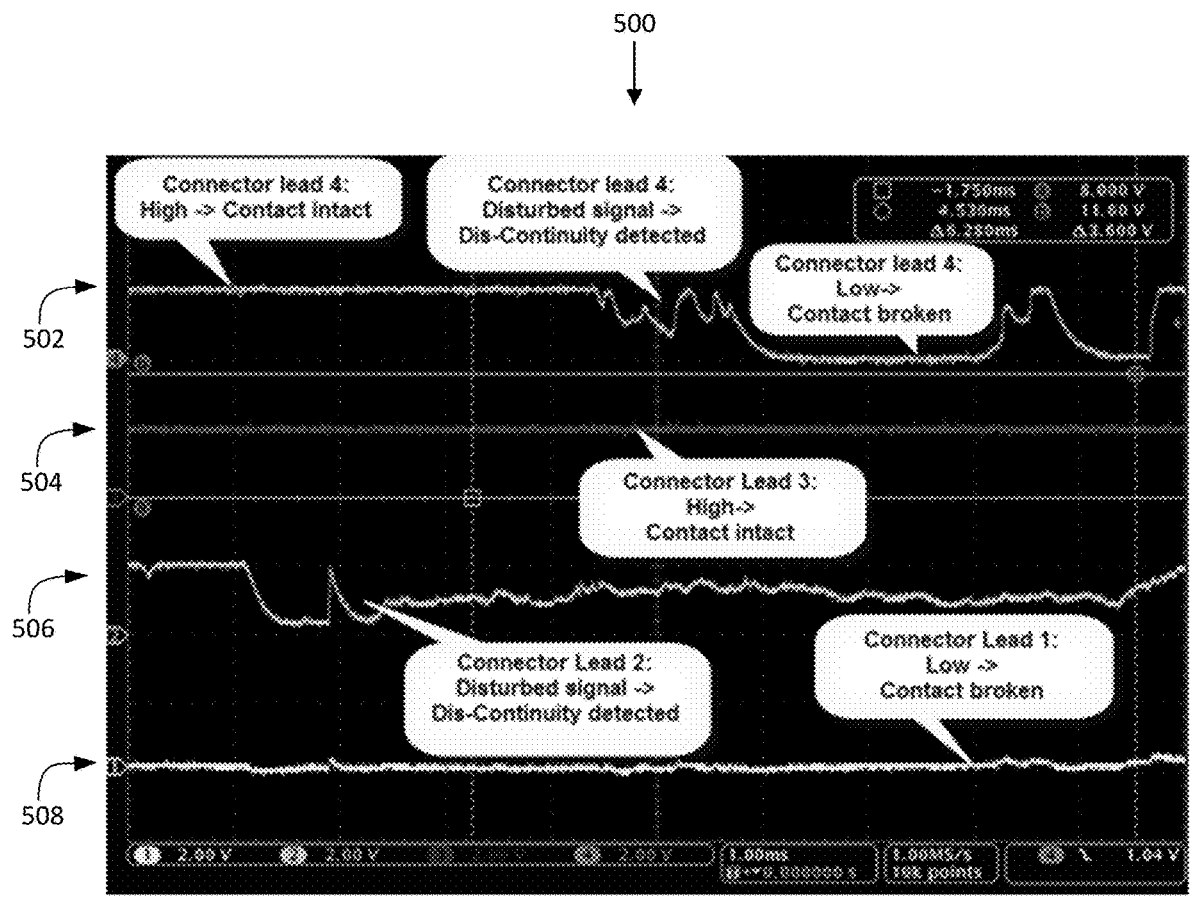
FIG. 5 is a plot illustrating an example output of an example micro-discontinuity measurement and simulation device, showing detected micro discontinuities.

FIG. 5 is a plot 500 illustrating an example intermittency detection test performed with the arrangement of FIG. 4. In the example test of FIG. 5, the connector signal pathways under test were subject to "fretting" under thermal and vibration stress. Fretting occurs when the interface between contacting surfaces undergoes repetitive low amplitude relative motion, which continuously exposes fresh, clean surfaces which react chemically with the environment to form reaction products. This process (fretting degradation) will produce high contact resistance because of the buildup of insulating material in the contact area.

The plot 500 of FIG. 5 includes four signal lines 502, 504, 506, 508 associated with four respective probe pairs (four measurement probes 108 and one bias probe 109 feeding static DC voltage to four signals on mating connector 404) and four respective signal pathways across connector 402 and mating connector 404. As annotated in FIG. 5, the first signal 508 is "low" for the entire time duration of the plot 500, indicating a broken signal pathway. The second signal 506 incudes a discontinuity (starts "high" and stays between "high" and "low" due to change of resistance or movement), indicating a micro-discontinuity induced by an environmental stress. The third signal 504 is "high" for the entire duration, indicating a functional signal path. Finally, the fourth signal 502 is "high" for first half of display period, indicating a functional signal path initially and intermittently toggling between "low" and "high" due to environmental stress, indicating a micro-discontinuity that was present in the signal pathway respective of the fourth signal across connector 402 and mating connector 404.

Figure 6:
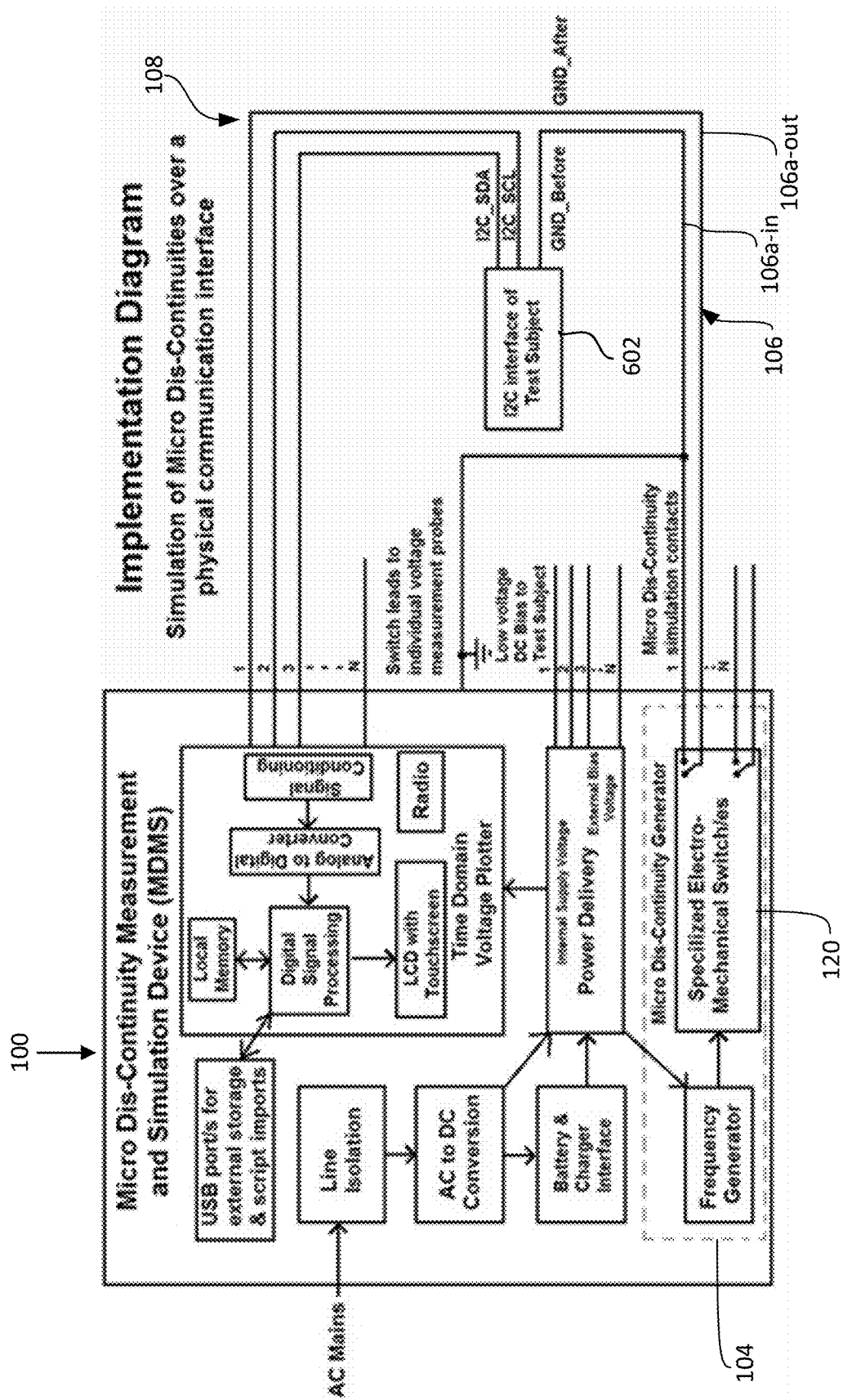
FIG. 6 is a schematic and block diagram view of an example embodiment of a micro-discontinuity measurement and simulation device in an example implementation for micro discontinuity detection and simulation.

FIG. 6 is a diagrammatic view of an example implementation of an MDMS device 100 demonstrating micro discontinuity simulator functionality along with measurement functionality. Specifically, FIG. 6 illustrates the device 100 implemented to test an I2C interface 602 as a test circuit. The arrangement illustrated in FIG. 6 may be applied to any other physical communication system, including but not limited to high-speed communications such as Ethernet or USB or similar, provided that the implementation does not materially alter the characteristic impedance of the communication system. In the embodiment illustrated in FIG. 6, the generator 104 (e.g., a single switch 120 of the generator) is electrically coupled with the GND (and may alternatively be coupled with the Return) signal of the I2C interface 602 test circuit via simulator probes pair 106*a*-in and 106*a*-out, which may be induced with one or more temporal micro-discontinuities using switch 120, and the measurement probes 108*c*, 108*b* and 108*a* are electrically coupled with the SDA, SCL of the I2C interface and 106*a*-out signals, respectively. The simulator 104 via simulator probes 106 may introduce contact discontinuity or interruptions on the GND or the return signal of the I2C interface of the test circuit 602. Such micro-discontinuity can be applied to any signal and not just to GND or return signals (e.g to SDA and SCL signals in this case).

Figure 7:
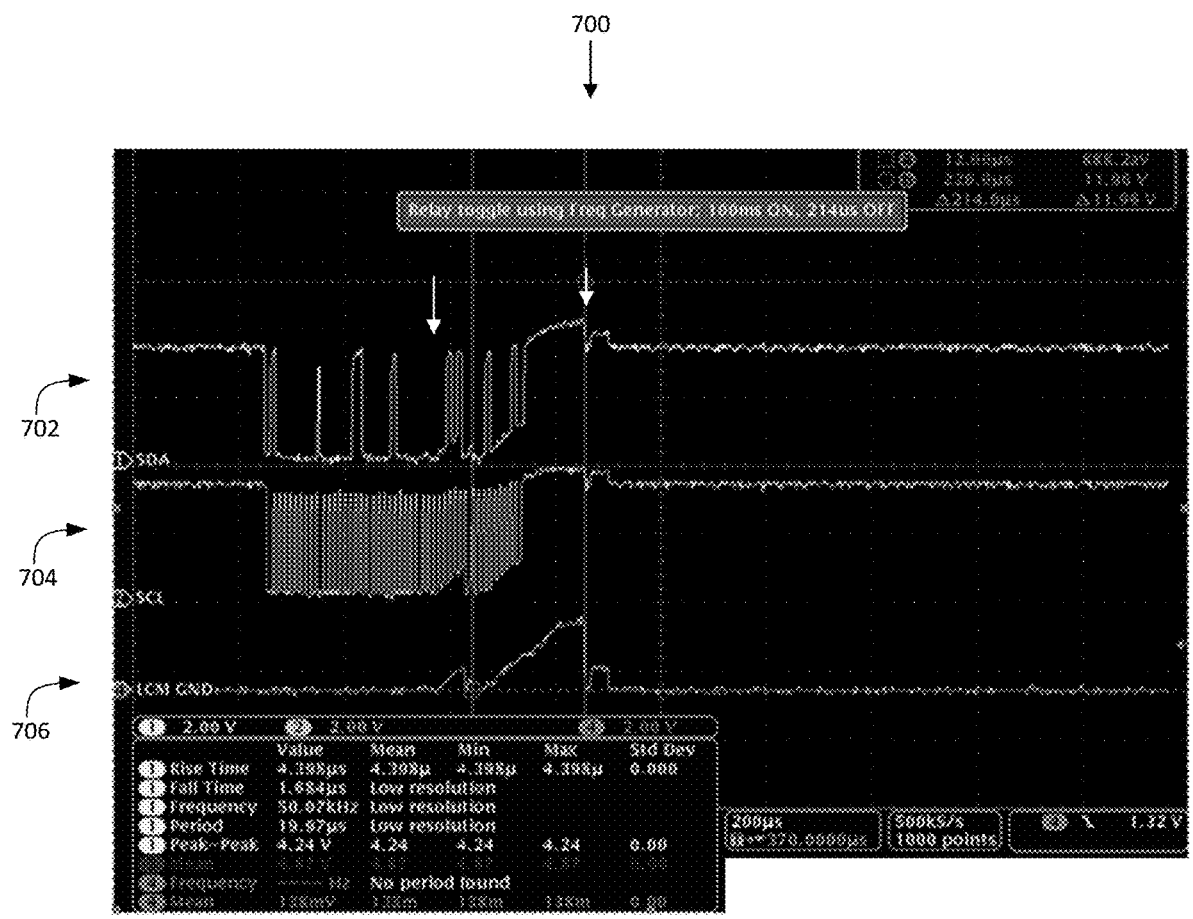
FIG. 7 is a plot illustrating an example output of an example micro-discontinuity measurement and simulation device, showing an example relationship of detected micro discontinuities to an input signal having simulated interruptions.

FIG. 7 is a plot 700 illustrating an example test performed with the arrangement of FIG. 6. Accordingly, plot lines 702, 704, 706 for SDA, SCL, and GND are illustrated in FIG. 7. In the example test illustrated in FIG. 7, the I2C interface (which is an external circuit relative to the device 100) is in use, and therefore the SDA and SCL lines carry signals not induced by the device 100. The switch 120 coupled to the GND line 706 is modulated by the device 100 to create interruptions between time points 708, 710. As shown in the SDA and SCL lines 702, 704, the result is a shrinking amplitude of data packets, which, in the absence of proper data integrity checks in software or firmware, may lead to interface failure. Even with good data integrity checks in software and/or firmware, these intermittencies may cause multiple re-tries and eventually cause system failure. From this test, a system engineer can establish that a fault in the GND of the I2C interface 602 under test may cause system failure, enabling the system engineer to understand the design requirements for a robust design to prevent such failure.

Figure 8:
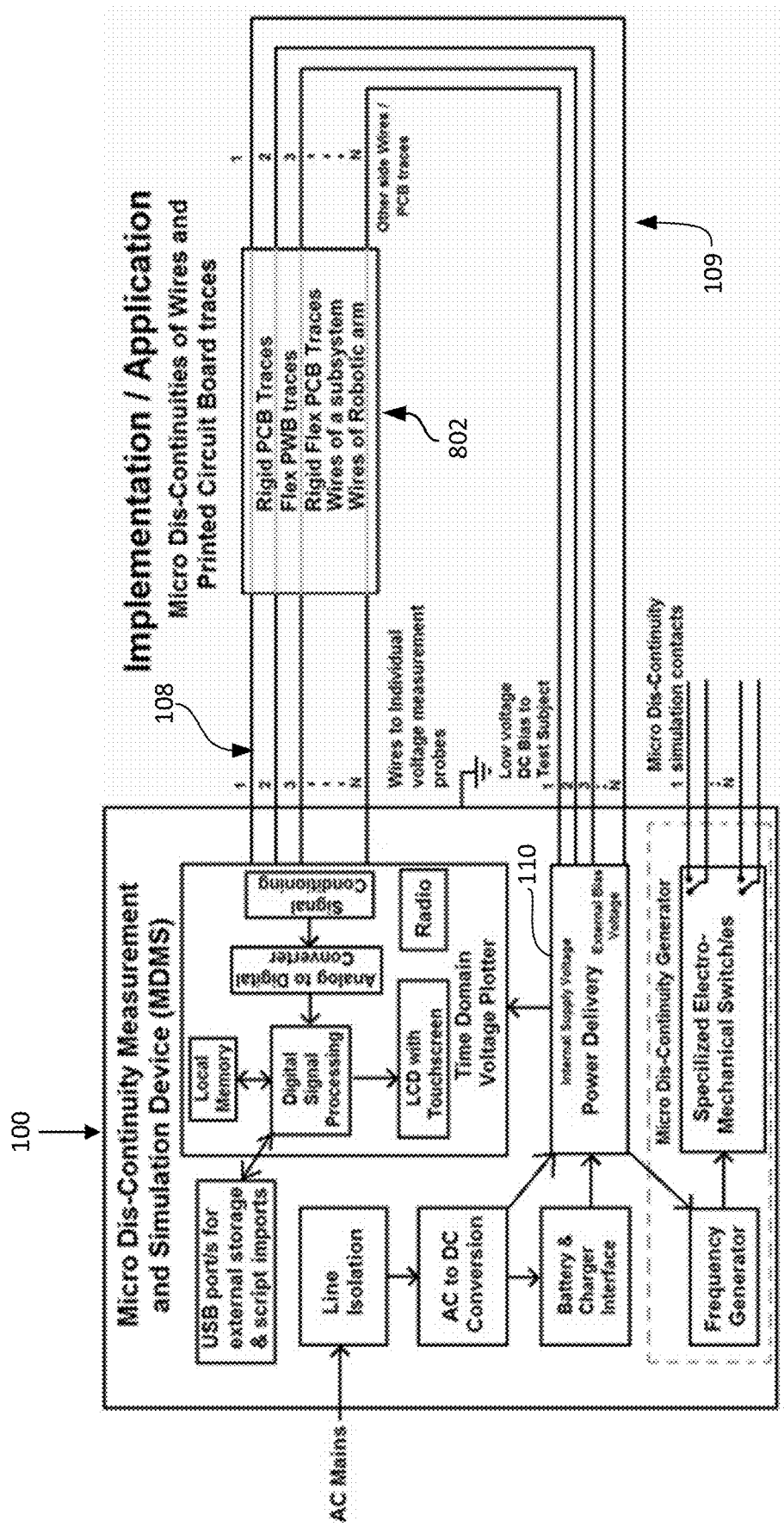
FIG. 8 is a schematic and block diagram view of an example embodiment of a micro-discontinuity measurement and simulation device in an example implementation for micro discontinuity detection.

FIG. 8 is a diagrammatic view of an example implementation of the MDMS device 100 demonstrating micro discontinuity measurement functionality. Specifically, in FIG. 8, the device 100 is electrically coupled with a plurality of physical interconnects 802 as independent test circuits, namely, rigid PCB (Printed Circuit Board) traces, flexible PWB (Printed Wiring Board) traces, rigid flex PCB traces, wires of a harness assembly subsystem, and wires of a robotic arm, which are examples of the many types of external circuits that can be tested with the device 100. Each interconnect 802 is also electrically coupled with external bias module 110 to receive a respective bias voltage using bias probes 109*a*, 109*b*, 109*c* and 109*n*. With the bias voltage applied, any of the interconnects 802 may be placed under environmental stress to test for micro-discontinuities that may show up as latent defects as measured by measurement probes 108*n*, 108*c*, 108*b* and 108*a* respectively and displayed on display 128.

The arrangement of FIG. 8, or portions thereof, may be used to detect contact discontinuities or intermittencies under stress leading to the root-cause of latent failures such as: the PCB under mechanical stress of a heavy onboard transformer bowing the PCB and leading to PCB trace intermittencies; the flexible PWB traces interfacing to a connector associated with a printer/scanner head movement causing trace intermittencies; the rigid-flex PCB interface post factory assembly process forming flex portion of the board into a different shape causing intermittencies at rigid and flex junctions; a harness assembly violating wire bend radius showing intermittencies under environmental vibrations (such as ones resulting from HVAC system); or wires of the robotic arm, which are expected to see numerous mechanical motions per day, showing intermittencies. As noted above, FIG. 8 shows a few of many possible applications of the MDMS device 100.

Figure 9:
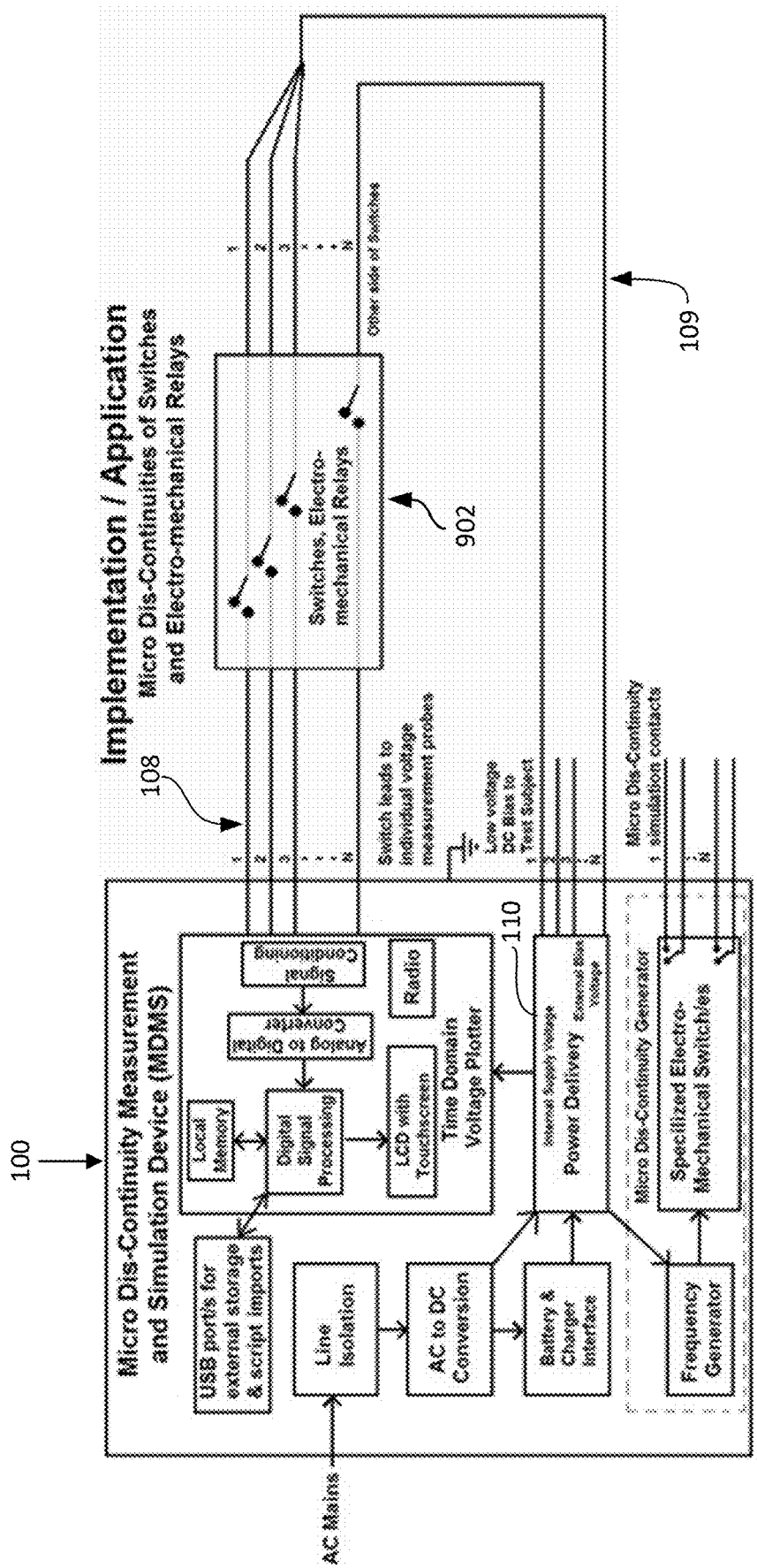
FIG. 9 is a schematic and block diagram view of an example embodiment of a micro-discontinuity measurement and simulation device in an example implementation for micro discontinuity detection.

FIG. 9 is a diagrammatic view of an example implementation of the device 100 demonstrating micro discontinuity measurement functionality. Specifically, FIG. 9 illustrates the device 100 electrically coupled with a plurality of switches 902, which may be any of mechanical switches or relays or electro-mechanical switches. Each of the switches 902 is also electrically coupled to the external bias module 110, so that a bias voltage may be applied using bias probes 109*a* and 109*n*. Each of the switches 902 may be tested under various bias voltages and stresses to detect latent failures or weaknesses.

Figure 10:
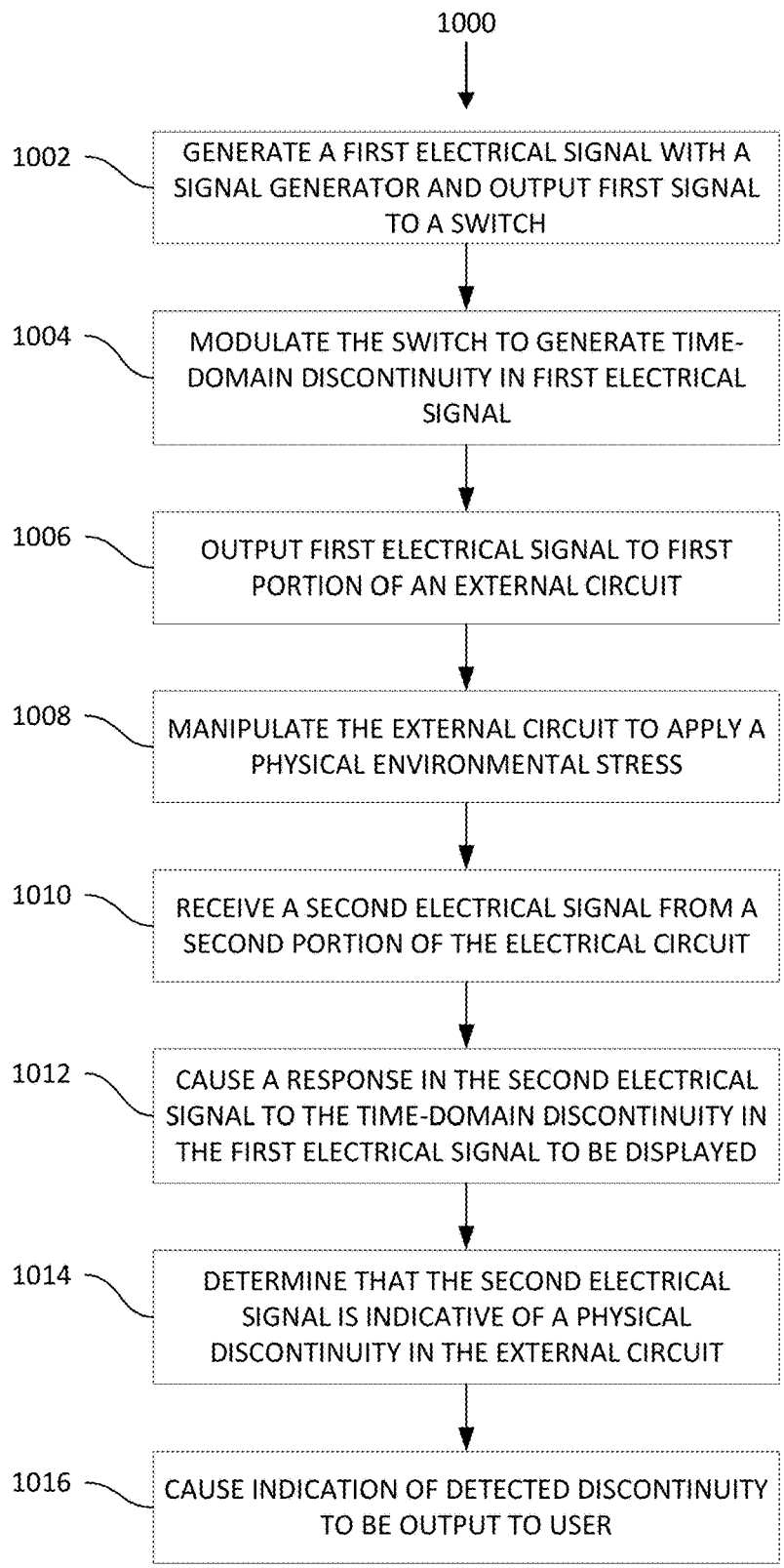
FIG. 10 is a flow chart illustrating an example method of determining one or more physical discontinuities in an electrical circuit.

FIG. 10 is flow chart illustrating an example method 1000 of determining one or more micro-discontinuities in an electrical circuit. One or more aspects of the method 1000 may be performed by the generator 104, the detector 102, a controller of the device 100, a user computing device 304, and/or a test environment manipulator 306, in some embodiments.

The method may include, at block 1002, generating a first electrical signal with a signal generator (e.g., signal generator 118) and outputting the first electrical signal to a switch (e.g., switch 120). In some embodiments, block 1002 may include generating a plurality of electrical signals, and outputting those signals to one or more switches. In some embodiments, a given signal may be input to a single switch. Additionally or alternatively, a given signal may be input to multiple switches, in series or in parallel. Block 1002 may be performed by the generator 104, in some embodiments.

The method 1000 may further include, at block 1004, modulating the switch to generate a time-domain discontinuity in the first electrical signal. Block 1004 may be performed by the generator 104, in some embodiments. The generator may act under instructions from controller of the device 100 or a user computing device 304, in some embodiments, at block 1004.

In some embodiments, modulating the switch to generate a time-domain discontinuity in the first electrical signal may include modulating the switch 120 to oscillate at a frequency. Such a frequency may be received from a user, for example. Additionally or alternatively, the frequency may be one that is predetermined and programmed into the device (e.g., the controller of the device 100) and selected automatically or selected by a user. Such predetermined frequencies may be representative of respective environmental disturbances, in some embodiments.

In embodiments in which multiple switches are provided, the switches may be modulated at block 1004 at the same or different frequencies with respect to each other. Accordingly, different environmental disturbances may be simulated on the same or different signals, and other combinations of time-domain discontinuities may be applied to the same or different signals.

The method may further include, at block 1006, applying the first electrical signal to a first portion of an external circuit (e.g., circuit 112) with a first probe (e.g., simulator probe 106). Block 1006 may be performed by the generator 104 with the first probe electrically coupled with the first portion of the external circuit.

In addition to or instead of the first electrical signal, the method 1000 may include (e.g., at block 1006) applying a DC bias voltage to the external circuit, such as at the first portion. The DC bias voltage may be output by the external bias module 110 of the device 100 through a bias probe 109, for example.

In embodiments in which a plurality of signals are generated with respective time-domain discontinuities, those signals may be output to respective portions of the external circuit with respective first probes at block 1006.

The method 1000 may further include, at block 1008, manipulating the external circuit to apply one or more physical environmental stresses to the circuit. Block 1008 may be performed by one or more environmental manipulators 306, and/or by the device 100 or a user computing device 304 commanding such manipulator(s).

The method may further include, at block 1010, receiving a second electrical signal from a second portion of the electrical circuit with a second probe (e.g., measurement probe 108). Block 1010 may be performed by the detector 102 with the measurement probe 108 electrically coupled with the second portion of the external circuit 112.

In some embodiments, a plurality of signals may be received at block 1010 by respective second probes coupled to respective portions of the external circuit. As a result, multiple different portions and components of the external circuit may be monitored for discontinuities in response to various input signals, including the signal(s) input through the first probe(s) at block 1006.

The method may further include, at block 1012, causing a response in the second electrical signal to the time-domain discontinuity in the first electrical signal to be displayed. Block 1012 may be performed by a controller of the device 100 (e.g., the DSP 126), in some embodiments. For example, the response may be output on a display 128 of the device 100 by outputting the second signal on a display of the device 100, in some embodiments. Additionally or alternatively, the response may be output by outputting the second signal to an external display.

In some embodiments of the method 1000, the first signal may also be output, such as alongside the second signal, for example, in block 1012 or otherwise. The display of the first and second signals may be synchronized in the time domain, in some embodiments. Accordingly, the user may review the first signal, and the time-domain discontinuity in the first signal, and the response in the second signal in time-synchronized output.

The method may further include, at block 1014, determining that the second electrical signal is indicative of a physical discontinuity in the external circuit. Determining that the second electrical signal is indicative of a physical discontinuity may include applying a signal analysis algorithm to the second signal to detect a time-domain discontinuity, anomaly, or irregularity. Block 1014 may be performed by a controller of the device 100, in some embodiments.

The method may further include, at block 1016, causing an indication of a detected discontinuity to be output to the user. Block 1016 may be performed by the controller of the device 100, for example. The indication may be a notation on an output plot of the second signal, in some embodiments. Additionally or alternatively, the indication may be a separate indicator light, an audible beep, or other output of the device 100. Still further, the indication may be a visual or audible indicator on a user computing device or other device.

The method 1000 may enable or include, in some embodiments, input of one or more DC or time-varying signals to an external circuit and automatic or manual monitoring of the response of the circuit at one or more portions for indicators of physical discontinuities. Physical manipulation of the external circuit to simulate physical stresses may be performed in conjunction with the application of input signals and monitoring. Accordingly, the method may enable various electrical signal and environmental stress stimuli to be input to the external circuit in various combinations to determine circumstances in which the external circuit does or does not exhibit signs of physical discontinuities, such as micro-discontinuities, so that the design of the external circuit may be made more robust and/or so that faulty circuits may be replaced, repaired, or discarded.

Figure 11:
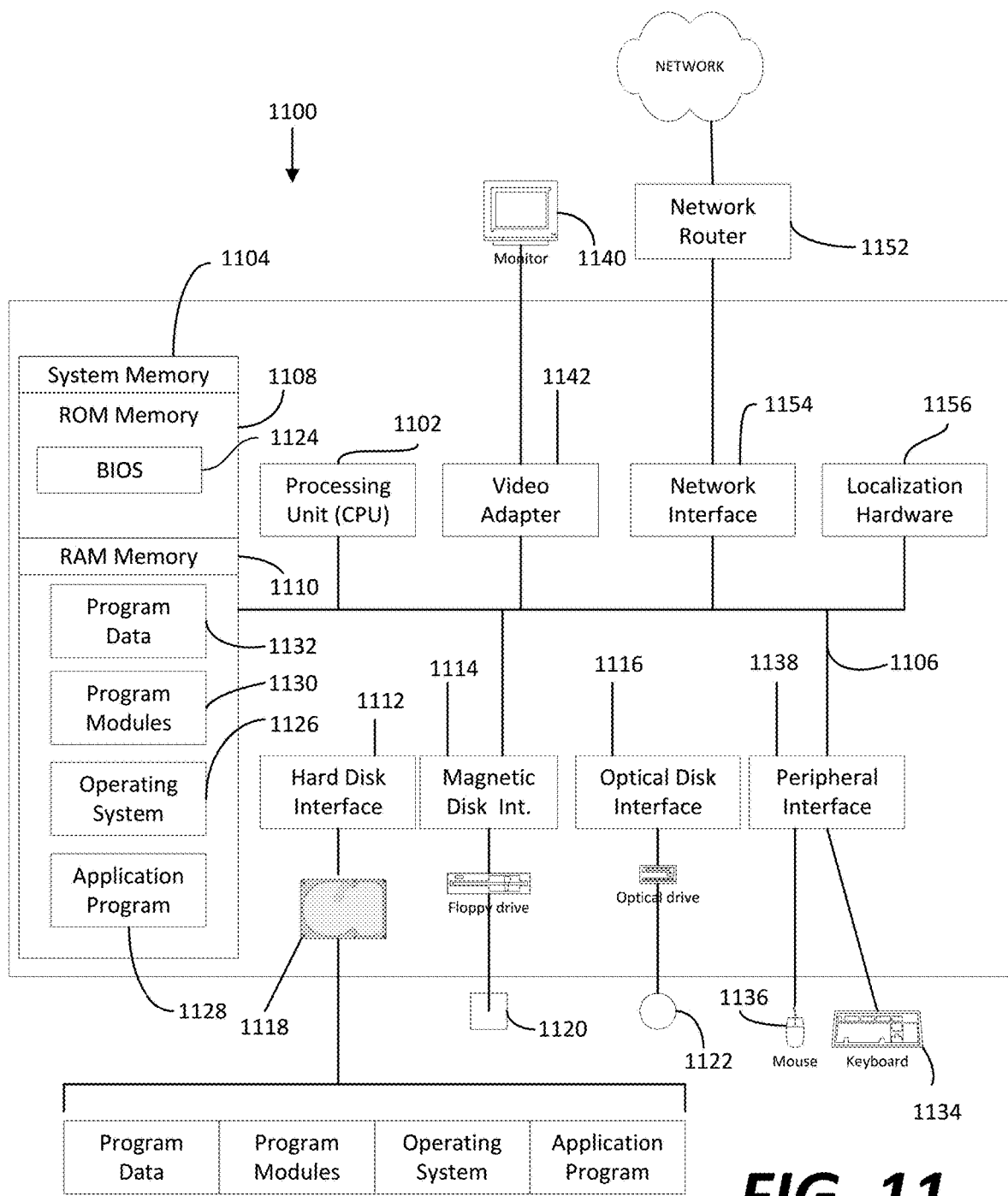
FIG. 11 is a diagrammatic view of an example embodiment of a user computing environment.

FIG. 11 is a diagrammatic view of an example embodiment of a user computing environment that includes a general purpose computing system environment 1100, such as a desktop computer, laptop, smartphone, tablet, or any other such device having the ability to execute instructions, such as those stored within a non-transient, computer-readable medium. Furthermore, while described and illustrated in the context of a single computing system 1100, those skilled in the art will also appreciate that the various tasks described hereinafter may be practiced in a distributed environment having multiple computing systems 200 linked via a local or wide-area network in which the executable instructions may be associated with and/or executed by one or more of multiple computing systems 1100. The system 1100, or portions thereof, may comprise the controller of the device 100 and/or the user computing device 306.

In its most basic configuration, computing system environment 1100 typically includes at least one processing unit 1102 and at least one memory 1104, which may be linked via a bus 1106. Depending on the exact configuration and type of computing system environment, memory 1104 may be volatile (such as RAM 1110), non-volatile (such as ROM 1108, flash memory, etc.) or some combination of the two. Computing system environment 1100 may have additional features and/or functionality. For example, computing system environment 1100 may also include additional storage (removable and/or non-removable) including, but not limited to, magnetic or optical disks, tape drives and/or flash drives. Such additional memory devices may be made accessible to the computing system environment 1100 by means of, for example, a hard disk drive interface 1112, a magnetic disk drive interface 1114, and/or an optical disk drive interface 1116. As will be understood, these devices, which would be linked to the system bus 1106, respectively, allow for reading from and writing to a hard disk 1118, reading from or writing to a removable magnetic disk 1120, and/or for reading from or writing to a removable optical disk 1122, such as a CD/DVD ROM or other optical media. The drive interfaces and their associated computer-readable media allow for the nonvolatile storage of computer readable instructions, data structures, program modules and other data for the computing system environment 1100. Those skilled in the art will further appreciate that other types of computer readable media that can store data may be used for this same purpose. Examples of such media devices include, but are not limited to, magnetic cassettes, flash memory cards, digital videodisks, Bernoulli cartridges, random access memories, nano-drives, memory sticks, other read/write and/or read-only memories and/or any other method or technology for storage of information such as computer readable instructions, data structures, program modules or other data. Any such computer storage media may be part of computing system environment 1100.

A number of program modules may be stored in one or more of the memory/media devices. For example, a basic input/output system (BIOS) 1124, containing the basic routines that help to transfer information between elements within the computing system environment 1100, such as during start-up, may be stored in ROM 1108. Similarly, RAM 1110, hard drive 1118, and/or peripheral memory devices may be used to store computer executable instructions comprising an operating system 1126, one or more applications programs 1128 (which may include one or more of the functions of the device controller disclosed herein), other program modules 1130, and/or program data 1132. Still further, computer-executable instructions may be downloaded to the computing environment 1100 as needed, for example, via a network connection.

An end-user, e.g., a user of device 100 or a user computing device 302 in communication with a device 100, may enter commands and information into the computing system environment 1100 through input devices such as a keyboard 1134 and/or a pointing device 1136. While not illustrated, other input devices may include a microphone, a joystick, a game pad, a scanner, etc. These and other input devices would typically be connected to the processing unit 1102 by means of a peripheral interface 1138 which, in turn, would be coupled to bus 1106. Input devices may be directly or indirectly connected to processor 1102 via interfaces such as, for example, a parallel port, game port, firewire, or a universal serial bus (USB). To view information from the computing system environment 1100, a monitor 1140 or other type of display device may also be connected to bus 1106 via an interface, such as via video adapter 1142. In addition to the monitor 1140, the computing system environment 1100 may also include other peripheral output devices, not shown, such as speakers and printers.

The computing system environment 1100 may also utilize logical connections to one or more computing system environments. Communications between the computing system environment 1100 and the remote computing system environment may be exchanged via a further processing device, such a network router 1152, that is responsible for network routing. Communications with the network router 1152 may be performed via a network interface component 1154. Thus, within such a networked environment, e.g., the Internet, World Wide Web, LAN, or other like type of wired or wireless network, it will be appreciated that program modules depicted relative to the computing system environment 1100, or portions thereof, may be stored in the memory storage device(s) of the computing system environment 1100.

The computing system environment 1100 may also include localization hardware 1156 for determining a location of the computing system environment 1100. In embodiments, the localization hardware 1156 may include, for example only, a GPS antenna, an RFID chip or reader, a WiFi antenna, or other computing hardware that may be used to capture or transmit signals that may be used to determine the location of the computing system environment 1100.

Figure 12:
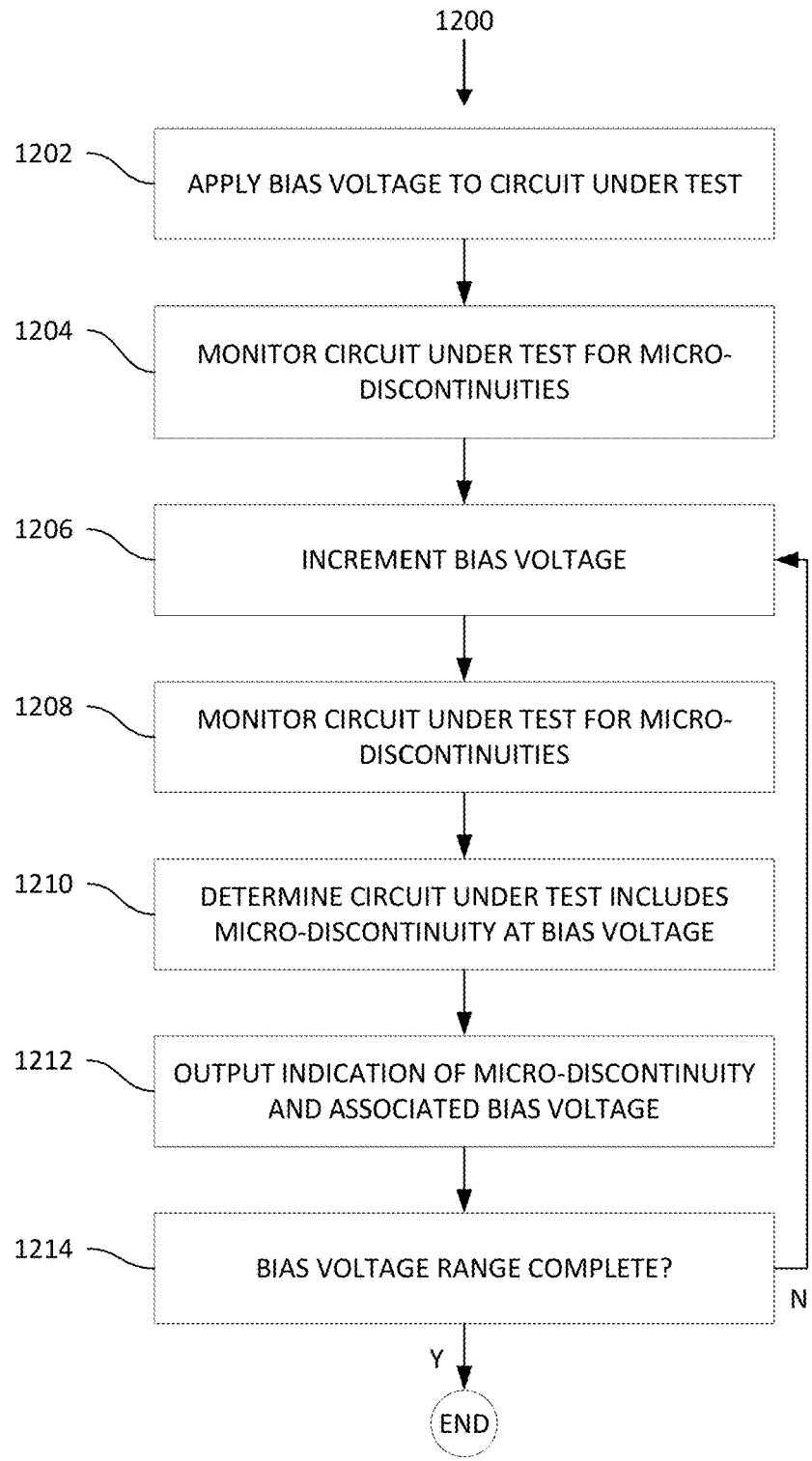
FIG. 12 is a flow chart illustrating an example method of determining one or more physical discontinuities in an electrical circuit.

FIG. 12 is flow chart illustrating an example method 1200 of determining one or more micro-discontinuities in an electrical circuit. One or more aspects of the method 1200 may be performed by the generator 104, the detector 102, a controller of the device 100, and/or a user computing device 304, in some embodiments. The method 1200 may be performed automatically to determine one or more bias voltage levels at which one or more portions of the circuit under test reveals micro-discontinuities. Accordingly, the method may be performed with one or more bias probes 109 coupled to the circuit under test for applying bias voltages to one or more portions of the circuit under test, and one or more measurement probes 108 coupled to the circuit under test for measuring signals through desired portions of the circuit under test.

The method 1200 may include, at block 1202, applying a first bias voltage to a circuit under test. The first bias voltage may be applied by the external bias module 110 of the device 100 through a bias probe 109, for example. The first bias voltage may be applied to one or more portions of the circuit under test.

The method 1200 may further include, at block 1204, monitoring the circuit under test for micro-discontinuities. Monitoring may be performed automatically through one or more voltage measurement probes 108 by the detector 102.

The method 1200 may further include, at block 1206, incrementing the bias voltage. The bias voltage may be incremented by the external bias module 110. In some embodiments, the bias voltage may be incremented according to a predetermined increment. The predetermined increment may be set according to a bias voltage range received from the user, for example. In such an embodiment, the increment may be a predetermined percentage of the range. In another embodiment, the predetermined increment may be an increment selected by the user.

Figure 13:
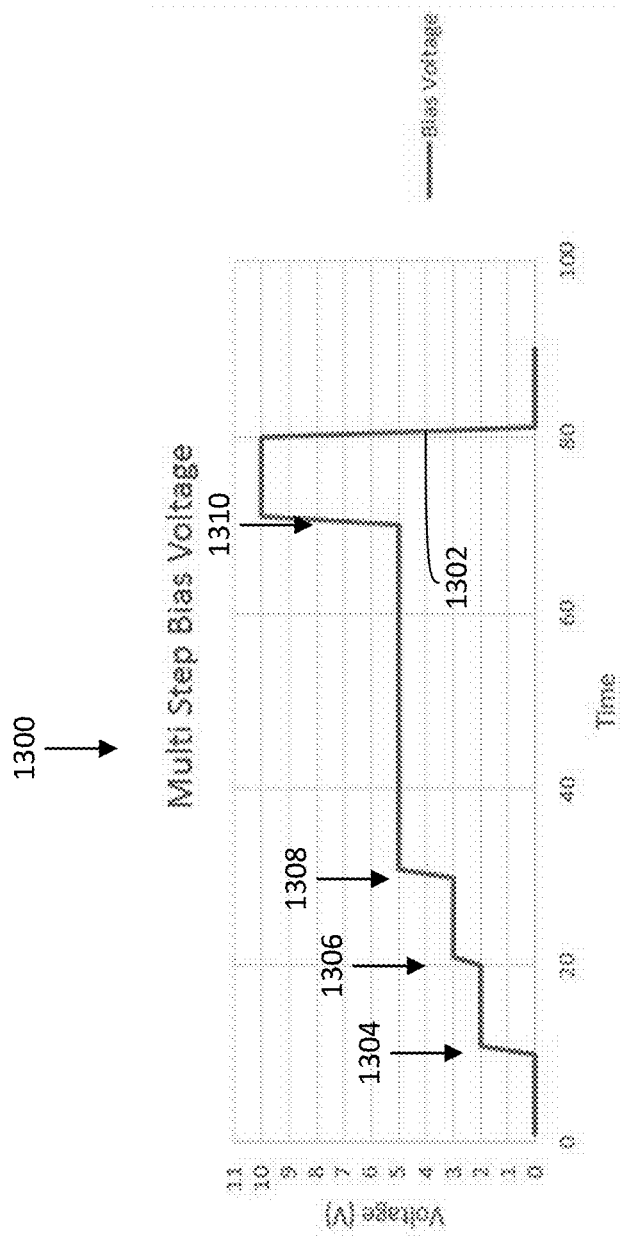
FIG. 13 is a plot illustrating an example DC bias voltage sequence that may be applied in the method of FIG. 12.

FIG. 13 is a plot 1300 illustrating an example bias voltage 1302 with multiple increments. The plot 1302 illustrates an instance 1304 of block 1202 (i.e., applying a bias voltage), as well as multiple instances 1306, 1308, 1310 of block 1206 (incrementing the bias voltage).

Referring again to FIG. 12, the method 1200 may further include, at block 1208, monitoring the circuit under test for micro-discontinuities. Monitoring may be performed automatically through one or more voltage measurement probes 108 by the detector 102. Monitoring may include applying one or more signal analysis algorithms to the respective signals on the one or more measurement probes 108.

The method 1200 may further include, at block 1210, determining that the circuit under test includes a micro-discontinuity at the incremented bias voltage. The determination may be made according to the result of one or more of the algorithms applied at block 1208, or may otherwise be performed by the detector 102. At block 1210, it may be determined that a micro-discontinuity exists at one monitored portion of the circuit under test, but not other monitored portions, in some embodiments.

The method 1200 may further include, at block 1212, outputting an indication of the determined micro-discontinuity and the bias voltage associated with that micro-discontinuity. In some embodiments, the output at block 1212 may further include a specific measurement probe 108 associated with the signal in which the micro-discontinuity was determined. The output at block 1212 may be on a display 128 of the device 100, in some embodiments.

The method 1200 may further include, at block 1214, determining if the desired bias voltage range for testing is complete. In some embodiments, as noted above, the range may have been received from a user. In such embodiments, block 1214 may include whether the entire user-provided range has been covered. In other embodiments, the range may be open ended-until a bias voltage is discovered that reveals one or more micro-discontinuities in the circuit under test. Accordingly, in some embodiments, block 1214 may include determining if one or more micro-discontinuities have been determined in the circuit under test.

If the entire range of bias voltages has not yet been covered, the method 1200 may return to block 1206 to again increment the bias voltage. If the entire range has been covered, the method 1200 may end.

While this disclosure has described certain embodiments, it will be understood that the claims are not intended to be limited to these embodiments except as explicitly recited in the claims. On the contrary, the instant disclosure is intended to cover alternatives, modifications and equivalents, which may be included within the spirit and scope of the disclosure. Furthermore, in the detailed description of the present disclosure, numerous specific details are set forth in order to provide a thorough understanding of the disclosed embodiments. However, it will be obvious to one of ordinary skill in the art that systems and methods consistent with this disclosure may be practiced without these specific details. In other instances, well known methods, procedures, components, and circuits have not been described in detail as not to unnecessarily obscure various aspects of the present disclosure.

Some portions of the detailed descriptions of this disclosure have been presented in terms of procedures, logic blocks, processing, and other symbolic representations of operations on data bits within a computer or digital system memory. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic data capable of being stored, transferred, combined, compared, and otherwise manipulated in a computer system or similar electronic computing device. For reasons of convenience, and with reference to common usage, such data is referred to as bits, values, elements, symbols, characters, terms, numbers, or the like, with reference to various presently disclosed embodiments. It should be borne in mind, however, that these terms are to be interpreted as referencing physical manipulations and quantities and are merely convenient labels that should be interpreted further in view of terms commonly used in the art. Unless specifically stated otherwise, as apparent from the discussion herein, it is understood that throughout discussions of the present embodiment, discussions utilizing terms such as "determining" or "outputting" or "transmitting" or "recording" or "locating" or "storing" or "displaying" or "receiving" or "recognizing" or "utilizing" or "generating" or "providing" or "accessing" or "checking" or "notifying" or "delivering" or the like, refer to the action and processes of a computer system, or similar electronic computing device, that manipulates and transforms data. The data is represented as physical (electronic) quantities within the computer system's registers and memories and is transformed into other data similarly represented as physical quantities within the computer system memories or registers or other such information storage, transmission, or display devices as described herein or otherwise understood to one of ordinary skill in the art.

What is claimed is:

1. An electrical measurement apparatus comprising:
a DC bias voltage source configured to generate a DC bias voltage;
a bias voltage probe electrically coupled with the DC bias voltage source and configured to apply the DC bias voltage to an external circuit; and
a measurement probe configured to receive an electrical signal from the external circuit; and
a control unit configured to:
increment the DC bias voltage of the DC bias voltage source one or more times;
determine that the electrical signal includes a micro-discontinuity; and
output an indication of the micro-discontinuity and the bias voltage associated with the micro-discontinuity.

2. The apparatus of claim 1, further comprising:
receiving bias voltage range from the user;
wherein incrementing the DC bias voltage comprises incrementing the DC bias voltage by a predetermined percentage of the bias voltage range.

3. An electrical measurement apparatus comprising:
a signal generator configured to generate and output a first electrical signal;
a switch having an input and an output, the input of the switch coupled to the output of the signal generator;
a first probe coupled to the switch output and configured to apply the first electrical signal to a first portion of an external circuit;
a second probe configured to receive a second electrical signal from a second portion of the external circuit; and
a control unit configured to:
control the switch to generate a time-domain discontinuity in the first electrical signal;
receive the second electrical signal from the second probe; and
cause the device to output a response in the second electrical signal to the time-domain discontinuity in the first electrical signal.

4. The electrical measurement apparatus of claim 3, wherein the control unit is configured to control the switch to oscillate at a frequency.

5. The electrical measurement apparatus of claim 4, wherein the control unit is configured to receive a user input and to set the frequency according to the user input.

6. The electrical measurement apparatus of claim 4, wherein the control unit is configured to control the switch at one or more predetermined frequencies, each of the predetermined frequencies representative of an environmental disturbance associated with the external circuit.

7. The electrical measurement apparatus of claim 3, further comprising:
a display;
wherein the control unit is configured to output on the display the time-domain discontinuity in the first electrical signal and the response in the second electrical signal to the discontinuity.

8. The electrical measurement apparatus of claim 3, wherein:
the signal generator is configured to generate one or more first signals;
the switch comprises a plurality of switches, each coupled with one of the one or more first signals;
the first probe comprises a first plurality of probes, each coupled to a respective output of a respective one of the plurality of switches; and
the control unit is configured to control the switches to generate respective time-domain discontinuities in the one or more first electrical signals.

9. The electrical measurement apparatus of claim 8, wherein the second probe comprises a second plurality of probes, each configured to receive a respective second electrical signal from a respective second portion of the external circuit.

10. The electrical measurement apparatus of claim 3, further comprising:
a DC power supply; and
a third probe coupled with the DC power supply so as to apply a DC bias voltage to a third portion of the external circuit.

11. A method for measuring an electrical signal of a circuit, the method comprising:
generating a first electrical signal with a signal generator and outputting the first electrical signal to a switch;
modulating the switch to generate a time-domain discontinuity in the first electrical signal;
outputting the first electrical signal to a first portion of an external circuit;
receiving a second electrical signal from a second portion of the electrical circuit; and
cause a response in the second electrical signal to the time-domain discontinuity in the first electrical signal to be displayed.

12. The method of claim 11, wherein modulating the switch to generate a time-domain discontinuity in the first electrical signal comprises modulating the switch to oscillate at a frequency.

13. The method of claim 12, wherein modulating the switch to generate a time-domain discontinuity in the first electrical signal comprises:
receiving a user-input frequency; and
modulating the switch to oscillate at the user-input frequency.

14. The method of claim 12, wherein modulating the switch to generate a time-domain discontinuity in the first electrical signal comprises:
providing one or more predetermined frequencies, each of the predetermined frequencies representative of an environmental disturbance associated with the external circuit; and
modulating the switch at one or more of the predetermined frequencies.

15. The method of claim 11, further comprising causing the time-domain discontinuity in the first electrical signal and causing the response in the second electrical signal to the discontinuity to be displayed to a user.

16. The method of claim 11, further comprising:
generating one or more first signals;
modulating a plurality of switches, each coupled with one of the one or more first signals, to generate a plurality of respective time-domain discontinuities in the one or more first signals; and
outputting the one or more first electrical signal to one or more respective first portions of the external circuit.

17. The method of claim 16, further comprising receiving a plurality of respective second electrical signals from respective second portions of the electrical circuit.

18. The method of claim 17, further comprising supplying a DC bias voltage to a third portion of the external circuit.

19. The method of claim 18, further comprising manipulating the external circuit to apply a physical environmental stress to the external circuit while supplying the DC bias voltage and causing a response in the second signal to the physical environment stress to be displayed.

20. The method of claim 11, further comprising:
manipulating the external circuit to apply a physical environmental stress to the external circuit;
applying, by a signal processor, a signal analysis algorithm to detect a discontinuity in the second electrical signal responsive to the manipulation of the external circuit.

* * * * *